United States Patent [19]

Bovaird et al.

[11] Patent Number: 4,830,975

[45] Date of Patent: May 16, 1989

[54] METHOD OF MANUFACTURE A PRIMOS DEVICE

[75] Inventors: Arthur J. Bovaird, Santa Clara; Reza Fatemi, Santa Cruz, both of Calif.

[73] Assignee: National Semiconductor Corporation, Santa Clara, Calif.

[21] Appl. No.: 125,792

[22] Filed: Nov. 27, 1987

Related U.S. Application Data

[63] Continuation of Ser. No. 457,828, Jan. 13, 1983, abandoned.

[51] Int. Cl.$^4$ ............................................. H01L 29/78
[52] U.S. Cl. ......................................... 437/41; 43/62; 43/67; 43/72; 43/985; 148/DIG. 116; 148/DIG. 163; 357/23.11; 357/47; 357/55
[58] Field of Search ................. 437/41, 913, 924, 947, 437/62, 67, 72, 985; 148/DIG. 116, DIG. 163

[56] References Cited

U.S. PATENT DOCUMENTS

| | | | |
|---|---|---|---|
| 3,528,168 | 9/1970 | Adamic, Jr. | 357/23 S |
| 3,544,858 | 12/1970 | Kooi | 357/23 CS |
| 3,919,006 | 11/1985 | Tarui et al. | |
| 4,013,489 | 3/1977 | Oldham | |
| 4,016,587 | 4/1977 | De La Moneda | 357/23 |
| 4,160,683 | 7/1979 | Roche | 357/23 S |
| 4,206,005 | 6/1980 | Yeh et al. | |
| 4,225,875 | 9/1980 | Ipri | |
| 4,228,447 | 10/1980 | Sato et al. | |
| 4,231,051 | 10/1980 | Custode et al. | 357/23 CS |
| 4,233,091 | 11/1980 | Kawabe | |
| 4,252,579 | 2/1981 | Ho et al. | |
| 4,256,514 | 3/1981 | Pogge | |

OTHER PUBLICATIONS

Ghandhi, Sorab K., "VLSI Fabrication Principles" John Wiley & Sons, 1983, pp. 383–384.
Rideout "Device Process for Raised Junction Mosfet" IBM Tech. Discl. Bull. vol. 18, No. 5, Oct. 1975, pp. 1617–1618.
Frensley, Power-Limiting Breakdown Effects in Gaas Mesfets, IEEE Transactions, vol. Ed. 28, #Aug. 8, 1981, pp. 962–970.
Smith et al. UMOS Power Field Effect Transistor Solid State Electronics, vol. 23 (1980), pp. 687–692.
Salama et al., Nonplanar Field-Effect Transistors, IEEE Transactions, vol . ED-25, #10, Oct. 1978, pp. 1222–1228.
Najort et al., An Analysis of the Concave Mosfet, IEEE Transation, vol. FD-25, #Apr. 4, 1978.
Salama, A New Short Channel Mosfet Structure (UMOST), Solid State Electronics, 1977, vol. 20, pp. 1003–1009.
Middlehoer et al., A Polysilicon Source and Drary MOS Transistor (PSDMOST) IEEE Transactions, May 1976, pp. 523–525.
Maeda et al. Pre-Aligned Gate MOS Devices Using Doped Polycrystalline Silicon Technology, International Electron Device, 1971 pp. 45–46.
Nishimatsu et al., Grooved Gate Mosfet, Japanese Journal of Applied Physics, vol. 16 (1977), Supp. 16-1, pp. 179–183.

Primary Examiner—Brian E. Hearn
Assistant Examiner—Beverly A. Pawlikowski
Attorney, Agent, or Firm—Gail W. Woodward; Lee Patch; Mark Aaker

[57] ABSTRACT

A PRIMOS (Planar Recessed Isolated MOS) transistor and a method for fabricating same is described wherein the source and drain in a semiconductor body are separated by a recess. A gate oxide is disposed on the body in the recess, with conductive gate material thereon. Oxide regions are positioned on each side of the gate, such oxide regions being substantially thicker in cross-section than the gate oxide. The method described teaches fabrication of this device.

6 Claims, 2 Drawing Sheets

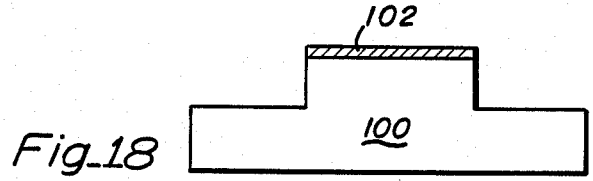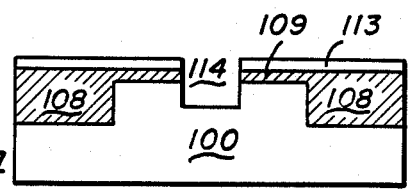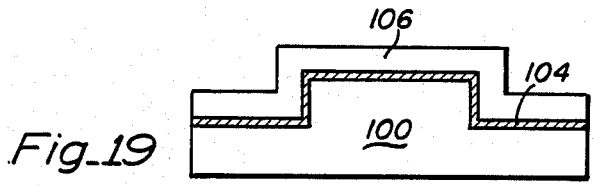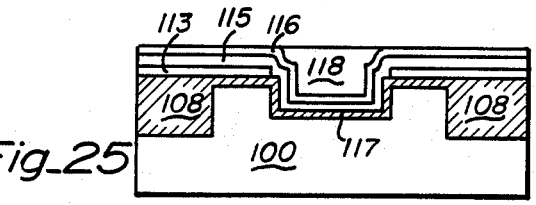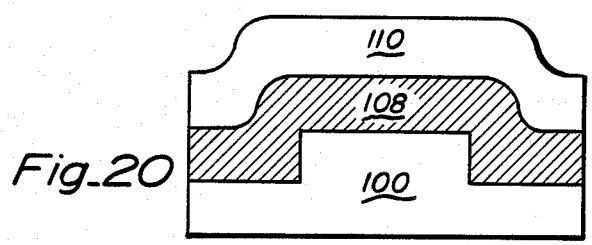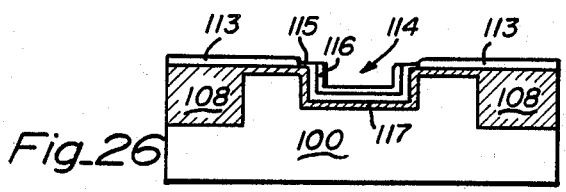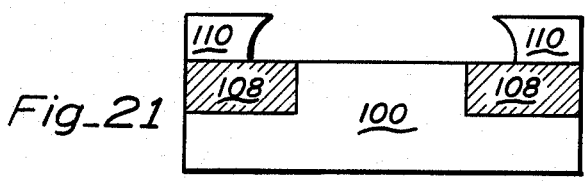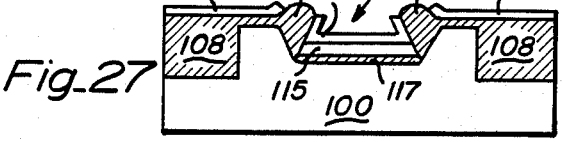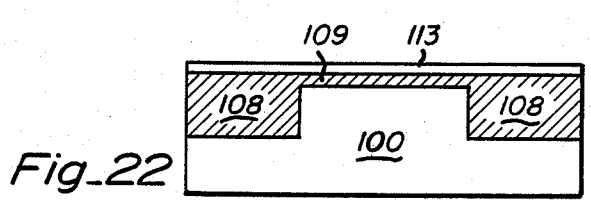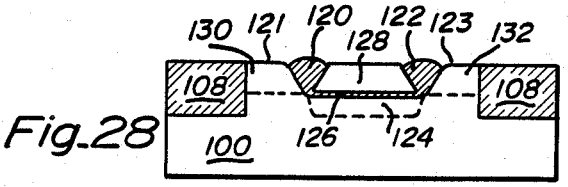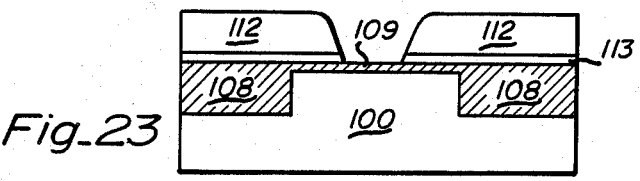

METHOD OF MANUFACTURE A PRIMOS DEVICE

This is a continuation of co-pending application Ser. No. 457,828 filed on Jan. 13, 1983 now abandoned.

BACKGROUND OF THE INVENTION

This invention relates to PRIMOS devices, and to a method of fabricating the same.

As is well known, the semiconductor industry continually seeks the fabrication of MOS devices so as to increase density, speed and reliability thereof, meanwhile achieving high device yield. The achievement of high density and speed require extremely small dimensioning, use of high conductivity components, low overlap capacitance, minimum alignment and dimension tolerances, and the use of multi-level interconnections.

Achievement of high yield and reliability relies on such factors as: use of high quality bulk silicon, controlling of device and parasitic parameters, use of high integrity conductors, a minimum number of processing steps, use of radiation hardness techniques, the ability to passivate devices, and minimum topology.

Certain of these advantages are provided in a UMOS device of the type disclosed in the technical paper entitled "GROOVED GATE MOSFET" by Nishimatsu, et al, published in 1976. As shown in that document, the u-shaped oxide in cross-setion is generally uniform in thickness throughout its full length on either side of and under the gate. This provides the problem that overlap capacitance is greater than desirable. The structure, as constructed, with polysilicon as the doping sources, must suffer control problems when forming the junctions in the bulk silicon. With polysilicon being a major portion of the groove sides, the oxide integrity grown thereon would be a major problem. Furthermore, the structure as proposed is not planar with the field oxide surface.

SUMMARY OF THE INVENTION

Accordingly, an object of this invention is to provide a PRIMOS device and method of making same, which overcomes the above-cited problems by providing highly efficient operation thereof.

Broadly stated, the invention comprises a semiconductor device comprising a body of a first conductivity type having first and second spaced apart regions of a second conductivity type, a gate insulator on the body in a recess thereof between the first and second regions, a conductive body on the gate insulator, said conductive body positioned so that at least a portion thereof is disposed between the first and second regions, and a first insulating material portion between the first region and the conductive body, and a second insulating material portion between the second region and conductive body respectively, wherein the cross-sectional thickness of the first insulating material portion, as measured in the direction from the first region toward the conductive body, is substantially greater than the cross-sectional thickness of the gate insulator.

Broadly stated, the invention also comprises a method of fabricating a semiconductor device comprising providing a body of a first conductivity type having first and second regions of a second conductivity type spaced apart by a recess in the body, the dopant level in the first and second regions varying adjacent the recess in the direction of the depth of the recess, and growing oxide material on portions of the first and second regions at a chosen temperature and pressure such that the rate of oxide growth is generally directly proportional to the level of concentration of dopant at such oxide growth. The invention also comprises a method of fabricating a semiconductor device comprising providing a semiconductor body having a recess therein, providing an oxide layer in the recess, providing a polysilicon layer on the oxide layer, providing a nitride layer on the polysilicon layer, and undertaking an oxidizing strip so as to provide oxide portions on each side of the recess which in cross-section taper inward in a direction of the recess.

BRIEF DESCRIPTION OF THE DRAWINGS

Other objects of the invention will become apparent from a study of the following specification and drawings, in which:

FIGS. 18 through 28 illustrate a third method of the invention, so as to form a third embodiment of the device.

DESCRIPTION OF THE PREFERRED EMBODIMENTS

Figure 1:
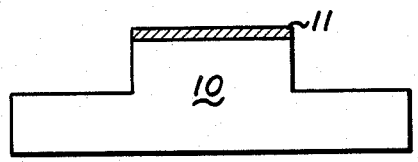
FIGS. 1 through 8 illustrate a first method of practicing the invention, so as to form a first embodiment of device.
Figure 2:
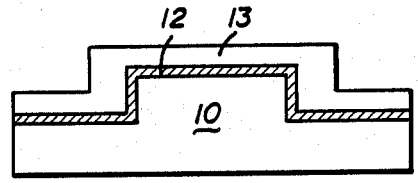
Figure 3:
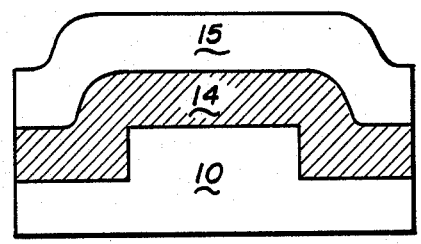
Figure 4:
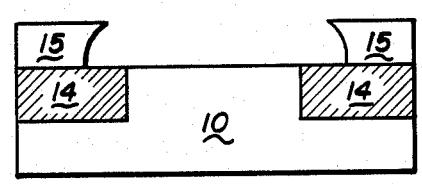
Figure 5:
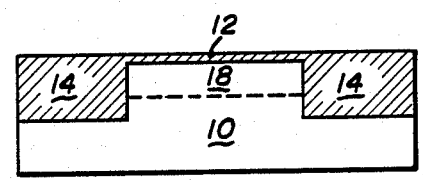

Referring to FIG. 1, a semiconductor silicon substrate or body 10 is provided, with a patterned layer of oxide 11 thereon. The substrate 10 is etched, using the oxide 11 as a mask. Oxide 11 is removed, and oxide 12 is then grown on the resulting structure. A layer of polysilicon 13 is deposited and oxidized to provide, with oxide 12, the oxide layer 14, and a layer of photoresist 15 is provided on the resulting structure (FIG. 3). The photoresist 15 is planarized and the oxide 14 is etched, using the photoresist 15 as a mask, to provide the structure shown in (FIG. 4). After removal of the photoresist 15, oxide is grown on the resulting structure, forming layer 12. Ion implanation is then undertaken to provide a region 18 of a second, opposite conductivity type in the substrate 10 as shown in (FIG. 5).

Figure 6:
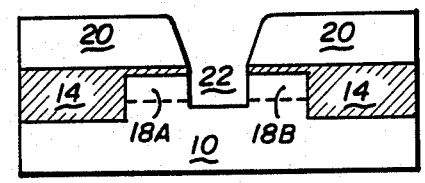
Figure 7:
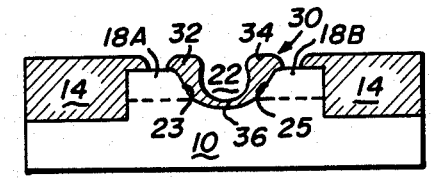

Photoresist 20 is then deposited over the resulting structure, and an opening is provided therein. The oxide 12 is then etched in a suitable etchant, exposing a portion of the substrate 10. The substrate 10 is then etched by appropriate etchant so as to define a recess 22. Formation of this recess provides that region 18 is made into two spaced apart regions 18A, 18B with the recess 22 being of sufficient depth to so provide complete separation of the regions 18A, 18B (FIG. 6). During the ion implantation step, the implantation is undertaken in accordance with well-known procedures so as to provide that concentration of dopant in a region (18A or 18B) decreases with the depth of the region. Thus, the concentration of dopant varies along the sides 23, 25 of the recess 22, and in fact decreases in the direction of the depth of the recess 22.

The photoresist 20 is then removed, and oxide 30 is grown on the resulting structure. This oxide step is a wet oxide growth undertaken at approximately 750° C., at a pressure of approximately 15 atmospheres. At this temperature and pressure, the oxide will grow at a rate generally directly proportional to the level of concentration of dopant at such oxide growth. Thus, because the dopant level in the regions 18A and 18B decreases with depth thereof in the direction of the depth of the recess 22, the oxide 36 will not grow as quickly in the depth of the recess 22 as near the top thereof, and in fact the oxide portions 32, 34 grown along the sides 23, 25 of the recess 22 taper inward in cross-section toward the gate insulator 36, the insulating portions 32, 34 and gate insulator 36 being continuous.

A conductive metal gate 38 is provided within the oxide portions 32, 34 and gate insulator 36. Openings 40, 42 are provided in the oxide above the regions 18A, 18B (source and drain) for providing appropriate contact therewith.

As will be seen, the cross-sectional thickness of the insulating material portion 32, as measured from the region 18A toward the conductive gate 38, and the cross-sectional thickness of the insulating material portion 34, as measured in the direction from the region 18B toward the conductive gate 38, are each substantially greater than the cross-sectional thickness of the gate insulator 36. This dimensioning of these oxide portions minimizes the overlap capacitance of the device, meanwhile fulfilling all other objectives as set forth above.

Figure 8:
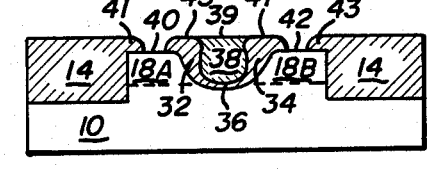

As will be noted in FIG. 8, the surfaces 41, 43 of the insulating material over the regions 18A, 18B the surfaces 45, 47 of the first and second insulating material portions 32, 34 and the surface 39 of the conductive gate 38 lie in substantially the same plane.

Figure 9:
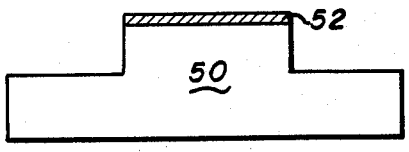
FIGS. 9 through 17 illustrate a second method of the invention, so as to form a second embodiment of the device.
Figure 10:
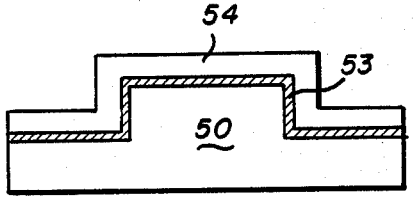
Figure 11:
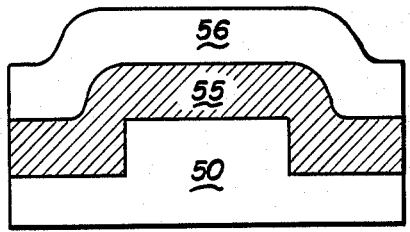
Figure 12:
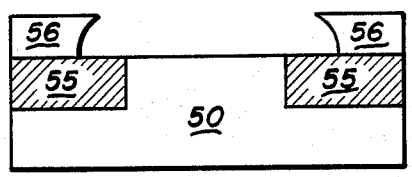
Figure 13:
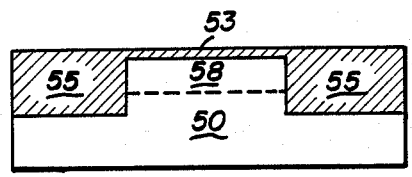

Referring to FIGS. 9 through 17, a semiconductor silicon substrate or body 50 is again provided, with a layer of oxide 52 thereon. The substrate 50 is etched, using the oxide 52 as a mask (FIG. 9). Oxide 52 is removed, and oxide 53 is grown on the resulting structure. A layer of polysilicon 54 is deposited (FIG. 10) and oxidized, to provide with oxide 53, the oxide layer 55, and a layer of photoresist 56 is provided on the resulting structure (FIG. 11). The photoresist 56 is planarized and the oxide 55 is etched, using the photoresist as a mask, to provide the structure shown in FIG. 12. After removal of the photoresist 56, oxide is grown on the resulting structure, forming layer 53. Ion implantation is then undertaken to provide a region 58 of a second, opposite conductivity type in the substrate 50 as shown in FIG. 13.

Figure 14:
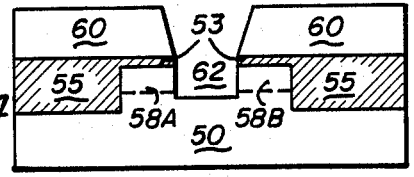
Figure 15:
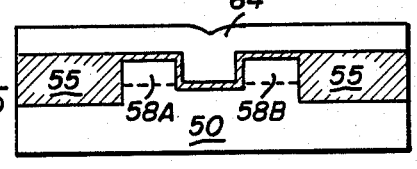

A layer of photoresist 60 is then provided, an opening is provided therein, the oxide 53 is etched to provide an opening therein, and substrate 50 is etched to again provide a recess 62 between and spaced apart regions 58A, 58B (FIG. 14). The photoresist is then removed and the oxide 53 is further etched. A wet oxide growth is then undertaken, in this case at a temperature of approximately 1000° C. and a pressure of approximately 15 atmospheres. Under such conditions of wet oxide growth, the growth of such oxide is substantially independent of doping level at the point of growth. Thus, the oxide portions in the areas over the regions 58A, 58B, and the recess 62, grow to substantially the same cross-sectional thickness.

Figure 16:
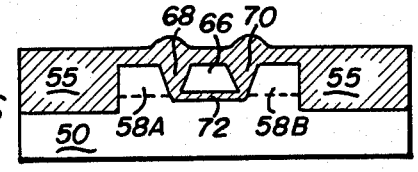
Figure 17:
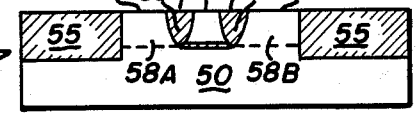

A layer of doped polysilicon 64 is then provided thereon (FIG. 15), and is etched using an appropriate etchant. Such polysilicon layer 64 is etched so that only a portion 66 within the recess 62 remains. The oxide is then subsequently etched to expose regions 58A, 58B. A wet oxide growth is then undertaken, this time at a temperature of approximately 750° C. and at a pressure of approximately 15 atmospheres. Similar to the previous embodiment, the oxide again grows at a rate substantially proportional to the level of dopant at the point of oxidation. In this case, some of the polysilicon portion 66 is used up in the growth of oxide in the areas between the polysilicon portion 66 and the first and second regions 58A, 58B respectively. Thus, the shape of the oxide material (68, 70) on either side of the polysilicon portion 66, and thereunder (72), is very similar to that achieved in the previous embodiment (FIG. 16).

In this embodiment, an oxide etch is then undertaken to expose the regions 58A, 58B (source and drain).

As will be seen, the surfaces 59A, 59B of the source and drain 58A, 58B, the surfaces 64, 65 of the insulating material portions 68, 70 and the surface 71 of the polysilicon portion (conductive gate) 66 lie in substantially the same plane.

Referring to FIG. 18-28, a semiconductor silicon substrate or body 100 is again provided, with a patterned layer of oxide 102 thereon. The substrate 100 is etched, using the oxide 102 as a mask (FIG. 18). Oxide 102 is removed, and oxide 104 is then grown on the resulting structure. A layer of polysilicon 106 is deposited to provide the structure shown in FIG. 19. The polisilicon 106 is then oxidized to provide, with oxide 104, the oxide layer 108, and a layer of photoresist 110 is provided on the resulting structure (FIG. 20). The photoresist 110 is then planarized.

The oxide 108 is then etched, using the photoresist 110 as a mask, to provide the structure shown in FIG. 21.

After removal of the photoresist 110, oxide is grown on the resulting structure, forming oxide layer 109, and a layer of nitride 113 is deposited thereon. Photoresist 112 is patterned over the layer of nitride 113, and the nitride 113 is etched, using the photoresist 112 as a mask (FIG. 23). The photoresist 112 is then removed. The oxide 109 and substrate 100 are then etched (FIG. 24), using the nitride 113 as a mask to define a recess 114 in the substrate 100. The recess surfaces are then oxidized (117). Successive layers of polysilicon 115 and nitride 116 are deposited over the resulting structure. A layer of photoresist 118 is deposited over the nitride layer 116 and portions of the photoresist layer 118 are removed to provide the structure shown in FIG. 25. Successive etching steps are undertaken, using the photoresist 118 as a mask, etching in turn the nitride layer 116, and the polysilicon layer 115. The photoresist 118 is then removed, leaving the structure shown in FIG. 26.

An oxidation step is then undertaken, wherein the polysilicon 115 is oxidized, to form the oxide insulating material portions 120, 122. These oxide insulating portions 120, 122 are positioned on either side of the recess 114 and are tapered inward in the direction inward of the recess 114.

Subsequently, the nitride 116, 113 and the polysilicon 115 are removed by appropriate steps, and the oxide is etched to expose the substrate 100 at portions 121, 123 and recess 114. A channel implant 124 is then undertaken as shown. The gate oxide 126 is then grown on the body 100 in the recess 114, being of uniform cross-sectional thickness and connecting the insulating portions 120, 122. A layer of doped polysilicon is then deposited over the resulting structure, and a layer of photoresist is provided thereon (not shown). The photoresist is shaped appropriately, and the polysilicon is etched so that a polysilicon gate 128 is provided on the gate oxide 126 between the insulating portions 120, 122. Subsequently, a source/drain implant is undertaken (130, 132) (FIG. 27 & 28).

It will readily be seen that in all embodiments, the objectives set forth above are achieved.

The structures developed allows independant formation of the structure elements while maintaining the self-alignment of device features and planarity of the surface, when imaging steps are required, making possible very high density structures. The extended depth of the source-drain regions increases their conductivity and makes unnecessary shallow junction processing problems. Deeper source-drain regions allow higher doping concentrations at the surface thereby reducing the contact resistance problems. Insulators and conductors are planar eliminating the problems of thinning and stress associated with step coverage.

The structures allow optimization of processing parameters to provide radiation hard devices or in simpler forms allow enhancement of particular device parameters. High voltage, high current devices may be constructed as well as high speed, high density devices.

We claim:

1. A method of fabricating a semiconductor device comprising:

providing a body of a first conductivity type having first and second regions of a second conductivity type spaced apart by a recess in the body, the dopant level in the first and second regions varying adjacent the recess in the direction of the depth of the recess; and growing oxide material on portions of the first and second regions at a chosen temperature and pressure such that the rate of oxide growth is generally directly proportional to the level of concentration of dopant at such oxide growth.

2. The method of claim 1 wherein the dopant level adjacent the recess decreases in the direction of the depth of the recess.

3. The method of claim 2 and further comprising the step of providing an oxide layer of substantially uniform thickness in the recess, and providing polysilicon material in the recess prior to said step of growing oxide material.

4. The method of claim 2 and further comprising the step of providing a metal gate in the recess subsequent to the step of growing oxide material.

5. A method of fabricating a semiconductor device comprising:

providing a semiconductor body having a doped surface, an impurity concentration that decreases with depth into into said body and a recess therein, said recess being shaped to extend completely through said doped surface thereby to define a channel region in said semiconductor device;

providing an oxide layer in said recess;

providing a polysilicon layer on the oxide layer, said polysilicon layer being shaped to define a gate electrode on said oxide layer;

providing a nitride layer on the polysilicon layer, said nitride layer being shaped to conform to said gate electrode; and undertaking an oxidizing step so as to provide oxide portions of each side of the recess and exterior to the confines of said nitride layer which in cross-section taper inward in a direction inward of the recess.

6. The method of claim 4 and further comprising the steps of providing an oxide layer in the recess and in contact with the semiconductor body and connecting the tapered oxide portions, and providing a polysilicon gate in the recess on such oxide layer.

* * * * *